United States Patent
Orlowski et al.

(10) Patent No.: US 7,195,963 B2
(45) Date of Patent: Mar. 27, 2007

(54) METHOD FOR MAKING A SEMICONDUCTOR STRUCTURE USING SILICON GERMANIUM

(75) Inventors: Marius K. Orlowski, Austin, TX (US); Chun-Li Liu, Mesa, AZ (US); Choh-Fei Yeap, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 154 days.

(21) Appl. No.: 10/851,347

(22) Filed: May 21, 2004

(65) Prior Publication Data

US 2005/0260807 A1 Nov. 24, 2005

(51) Int. Cl.
*H01L 21/336* (2006.01)

(52) U.S. Cl. ............... 438/197; 438/285; 438/299; 438/300; 438/301; 257/E21.054

(58) Field of Classification Search ............ 438/197, 438/285, 299, 300, 301
See application file for complete search history.

(56) References Cited

U.S. PATENT DOCUMENTS

| | | | |
|---|---|---|---|
| 6,124,627 A | 9/2000 | Rodder | |
| 6,365,465 B1 * | 4/2002 | Chan et al. | 438/283 |
| 6,492,216 B1 | 12/2002 | Yeo | |
| 6,512,252 B1 * | 1/2003 | Takagi et al. | 257/192 |
| 6,621,131 B2 | 9/2003 | Murthy | |
| 6,656,782 B2 | 12/2003 | Skotnicki | |
| 2004/0092085 A1 * | 5/2004 | Kanzawa et al. | 438/479 |

FOREIGN PATENT DOCUMENTS

JP 2002329673 * 11/2002

OTHER PUBLICATIONS

Pezoldt et al., "SIMS and AES Investigation on the Influence of Ge Predeposition on the Interface Quality Between SiC and Si," Nanotechnology, Center of Mirco- and Nanotechnologies, TU Ilemanau, Germany, 7 pgs, No date.
De Salvador et al., "Carbon Precipitation and Diffusion in SiGeC Alloys Under Silicon Self-Interstitial Injection," Appl. Phys. A 75, pp. 667-672 (2001).
Kulik et al., "The Effect of Composition on the Thermal Stability of $Si_{1-x-y}Ge_xC_y/Si$ Heterostructures," American Institute of Physics, pp. 1972-1974 (1998).
Morales et al., "Influence of the Ge Coverage Prior to Carbonization on the Structure of SiC Grown on Si(111)," Dpto. De Ciencia de los Materiales e Ingernieria Metalurgica y Quimica Inorganica, Universidad de Cadiz, 4 pgs, No date.

* cited by examiner

*Primary Examiner*—Michael Trinh
(74) *Attorney, Agent, or Firm*—James L. Clingan, Jr.; David G. Dolezal

(57) ABSTRACT

Silicon carbon is used as a diffusion barrier to germanium so that a silicon layer can be subsequently formed without being contaminated with germanium. This is useful in separating silicon layers from silicon germanium layers in situations in which both silicon and silicon germanium are desired to be present on the same semiconductor device such as for providing different materials for optimizing carrier mobility between N and P channel transistors and for a raised source/drain of silicon in the case of a silicon germanium body.

8 Claims, 7 Drawing Sheets

METHOD FOR MAKING A SEMICONDUCTOR STRUCTURE USING SILICON GERMANIUM

FIELD OF THE INVENTION

This invention relates to semiconductor devices, and more particularly, to semiconductor devices that use silicon germanium.

RELATED ART

Silicon germanium has a number of potential uses in making semiconductor devices. For example, silicon germanium is attractive for use as a channel material in a PMOSFET transistor. In such case the silicon germanium is made to be compressive so that it provides improved hole mobility. Also silicon germanium is potentially useful in creating compressive stress in silicon to improve P channel transistor performance. In such case silicon source/drain regions are excavated and then filled with silicon germanium. The silicon germanium, in such a case, is under compressive stress and thereby its presence exerts lateral (in the channel length direction) compressive stress on the silicon channel region. Another application is the creation of local isolation that requires actually removing semiconductor material under the channel. This under channel semiconductor material that is removable that has been effective is silicon germanium. Silicon germanium that forms this under-channel semiconductor material can be removed by virtue of its high selectivity etch relative to silicon. Such high selectivity etch processes include wet and plasma chemistries.

A difficulty with this has been that some germanium atoms tend to out diffuse from the silicon germanium. Any such loose germanium atoms tend to continue diffusing until they reach silicon oxide. The silicon oxide stops the diffusion but the accumulation of germanium atoms at a silicon oxide interface that is also a gate dielectric causes changes in the interface state, reduces mobility, and degrades the reliability of the gate dielectric.

Thus, there is a need for to provide a method for achieving the benefit of one or more of the potentially beneficial uses of silicon germanium while avoiding the problems associated with germanium out-diffusion.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, silicon carbon is used as a diffusion barrier to germanium so that silicon and silicon oxide can be subsequently formed over the silicon germanium layer without being contaminated with germanium. This is better understood by reference to the figures and the following description.

Figure 1:
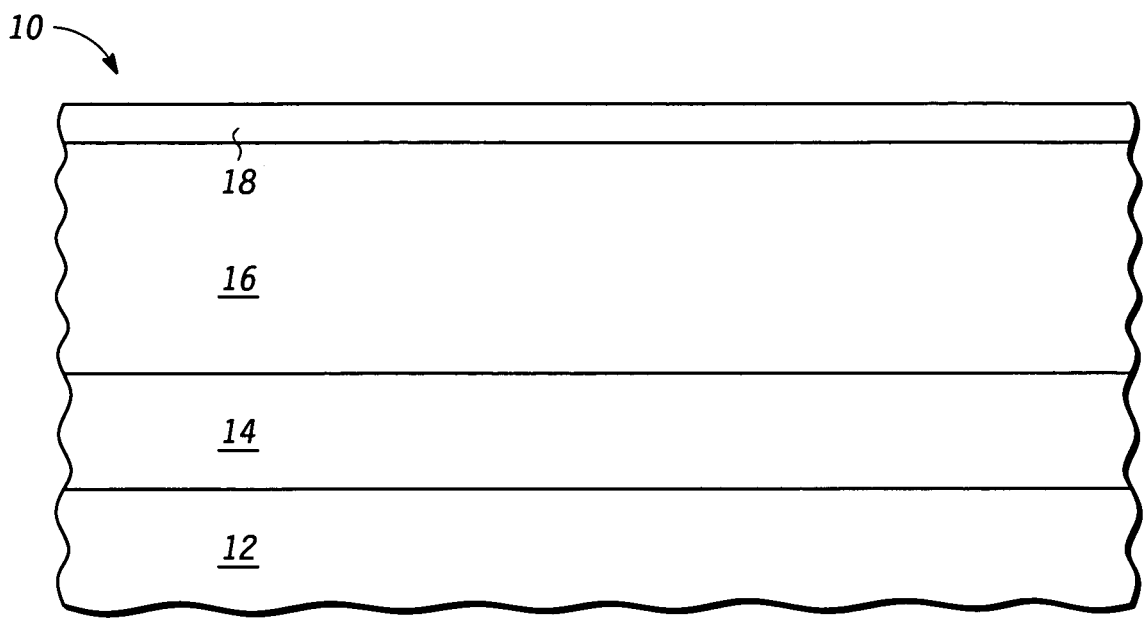
FIG. 1 is a cross section of a semiconductor structure at a first stage in processing according to a first embodiment of the invention.

Shown in FIG. 1 is a semiconductor structure 10 comprising a buried oxide 12, a semiconductor layer 14 of silicon on buried oxide 12, a silicon germanium layer 16 on semiconductor layer 14, and a silicon carbon layer 18 made up of silicon and carbon. Buried oxide layer 12 and semiconductor layer 14 together result in a relatively immovable substrate with silicon layer 14 under minimal stress and thus called relaxed. Silicon germanium layer 16 is compressively stressed. Silicon carbon layer 18 has a lattice structure that matches that of silicon germanium layer 16. Semiconductor layer 14 is preferably between 10 and 200 Angstroms thick. Semiconductor layer 14 is for setting the lattice constant of silicon germanium layer 16, which is preferably 400 Angstroms thick. Silicon carbon layer 18 is preferably 30 to 50 Angstroms thick. The carbon content of silicon carbon layer 18 is about 2% (mole fraction) but could vary from that. The carbon content, however, should be no more than 5%. Silicon carbon in this context means a crystalline matrix in which both silicon and germanium are part of the matrix itself. This is distinguished from carbon-doped silicon in which the carbon is not part of the matrix. Of course a silicon carbon layer may also have carbon that is not part of the matrix in that silicon carbon does not preclude that there may also be carbon doping present.

Figure 2:
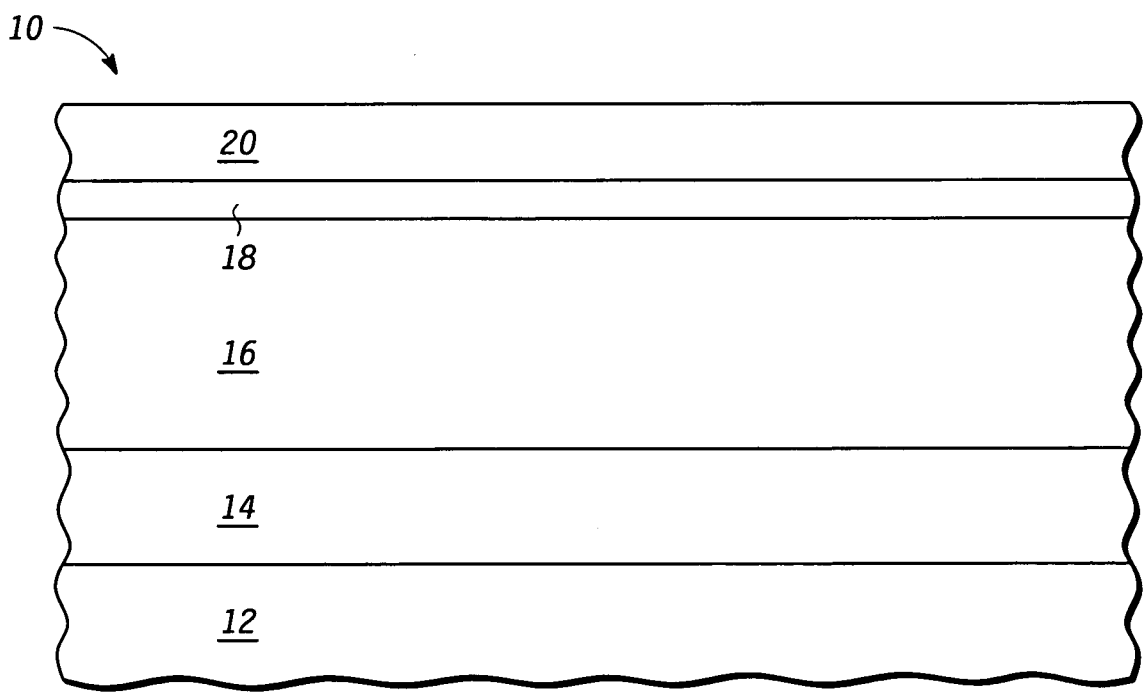
FIG. 2 is a cross section of the semiconductor structure of FIG. 1 at a subsequent stage in processing.

Shown in FIG. 2 is semiconductor structure 10 after formation of a silicon layer 20 on silicon carbon layer 18. Silicon layer 20 is preferably about 40 Angstroms thick. Semiconductor layer 14, silicon germanium layer 16, silicon carbon layer 18, and silicon layer 20 are all grown epitaxially.

Figure 3:
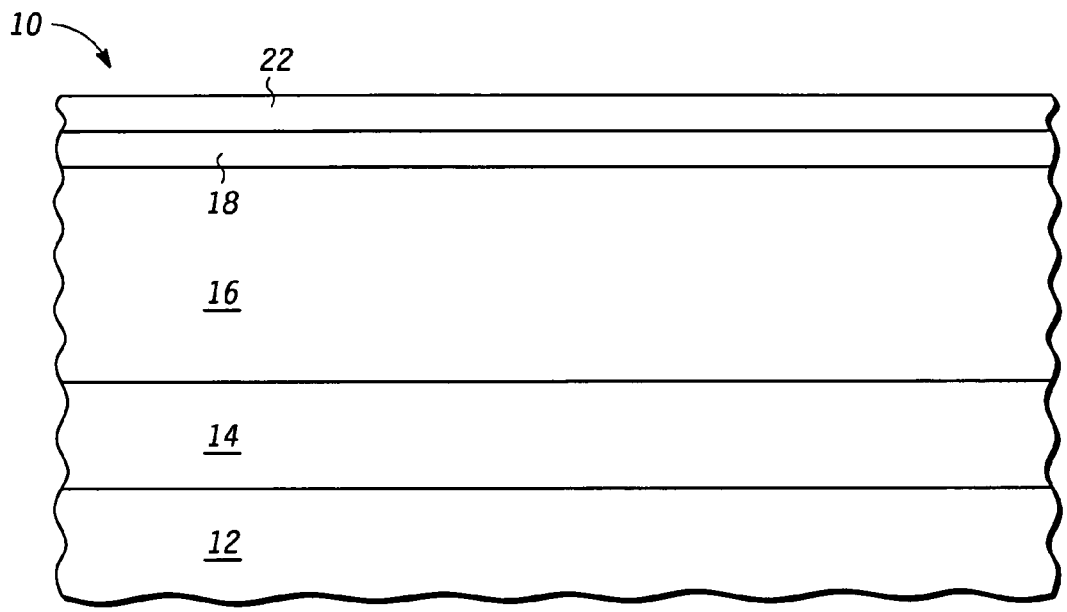
FIG. 3 is a cross section of the semiconductor structure of FIG. 2 at a subsequent stage in processing.

Shown in FIG. 3 is semiconductor structure 10 after growing a silicon oxide layer 22 using silicon layer 20. In preparation for the formation of silicon oxide layer 22, silicon layer 20 is cleaned and partially oxidized to form a sacrificial oxide. This sacrificial oxide is removed, and silicon oxide layer 22 is grown. Silicon oxide layer 22 is preferably 10 to 20 Angstroms. This sequence of oxidize, strip, and oxidize for forming a desired gate oxide is known to one of ordinary skill in the art. Silicon carbon layer 18 functions as a barrier to germanium atoms that reside in silicon germanium layer 16. This silicon carbon layer 18 thus prevents accumulation of germanium at the interface between silicon carbon layer 18 and silicon oxide layer 22. This silicon oxide layer 22 could also be replaced instead by another gate dielectric such as a metal oxide and would be protected from the adverse effects of germanium at the interface thereto.

Figure 4:
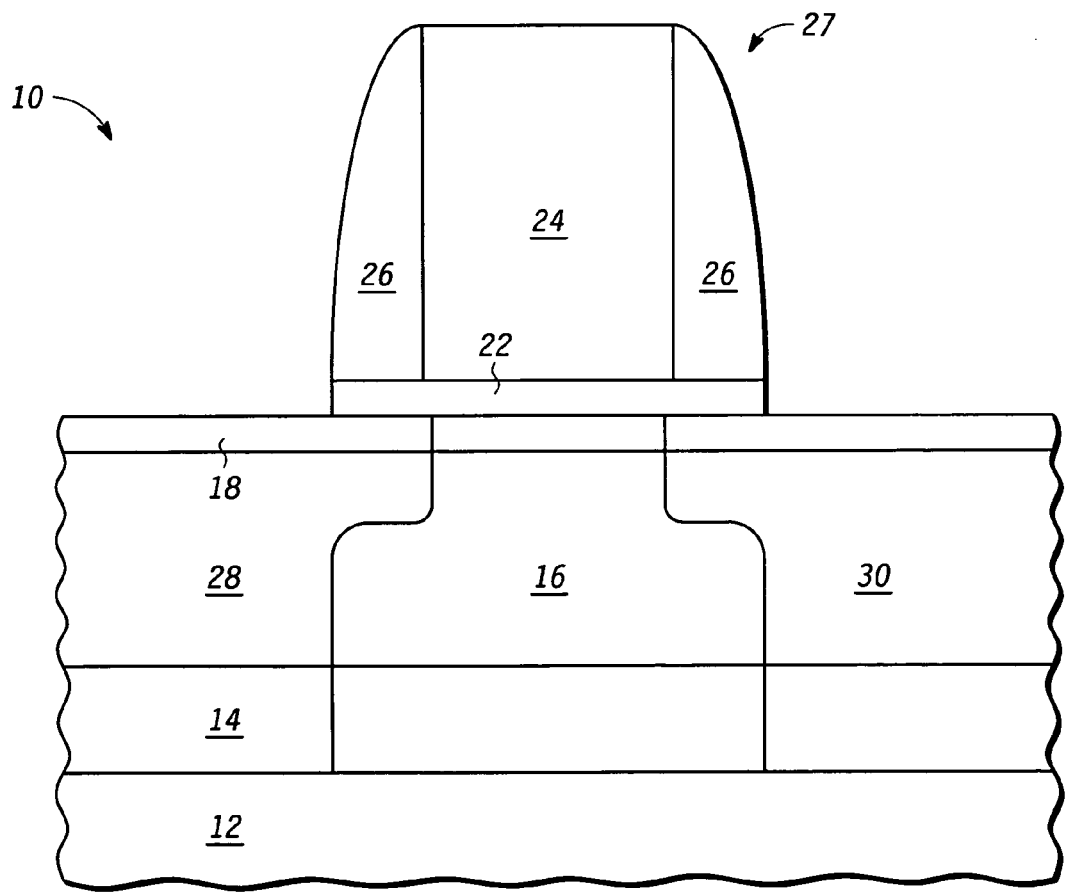
FIG. 4 is a cross section of the semiconductor structure of FIG. 3 at a subsequent stage in processing.

Shown in FIG. 4 is a transistor 27 formed in the structure of FIG. 3. Transistor 27 has a gate 24 formed over silicon oxide layer 22; a sidewall spacer 26 around gate 24; a source/drain region 28 formed adjacent to gate 24 on a first side in silicon carbon layer 18, silicon germanium layer 16, and silicon layer 14; and a source/drain 30 formed adjacent to gate 24 on a second side in silicon carbon layer 18, silicon germanium layer 16, and silicon layer 14. Forming transistor 27 from the structure of FIG. 3 uses techniques known to one of ordinary skill in the art.

Figure 5:
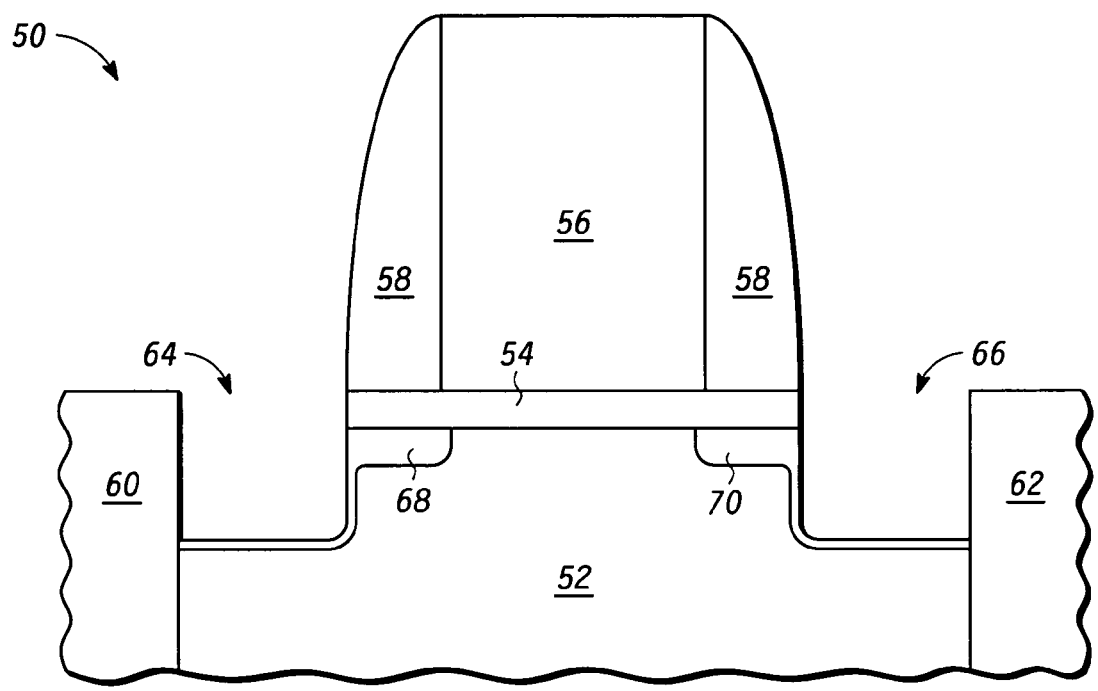
FIG. 5 is a cross section of a semiconductor structure according to the prior art.

Shown in FIG. 5 is semiconductor structure 50 of the prior art comprising a semiconductor substrate 52 of silicon, a gate dielectric 54 of silicon oxide, a gate 56 on gate dielectric 54, sidewall spacer 58 around gate 56, a cut out 64 in a source/drain region adjacent to gate 56, a trench isolation region 60 adjoining cut out 64, and a trench isolation region 62 adjoining cut out 66. This prior art structure is in preparation for filling cut outs 64 and 66 with silicon germanium, which will exert lateral stress on silicon substrate 52 in the area between cut outs 64 and 66. This area between cut outs 64 and 66 includes the channel, and the channel will thereby be under compressive uniaxial stress, which increases hole mobility.

Figure 6:
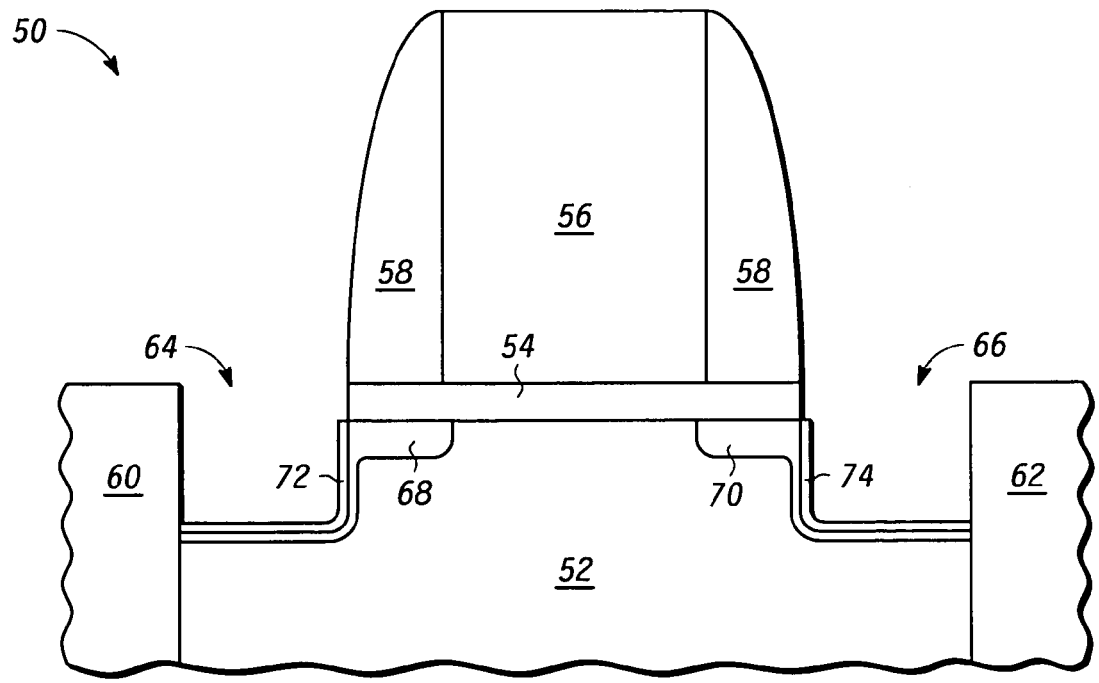
FIG. 6 is a cross section of the semiconductor structure of FIG. 5 at a subsequent stage in processing according to a second embodiment of the invention.

Shown in FIG. 6 is semiconductor structure 50 after formation of a silicon carbon layer 72 in cut out 64 and a silicon carbon layer 74 in cut out 66. Silicon carbon layers 72 and 74 are formed by selective deposition. The deposition of silicon carbon on silicon is achieved by flowing silane and methylsilane ($SiH_3CH_3$). Other sources of carbon may also be used with the silane including ethylene ($C_2H_4$) and propane ($C_3H_8$). The thickness of silicon carbon layers 72 and 74 is preferably between 30 and 60 Angstroms. It should be at least 20 Angstroms.

Figure 7:
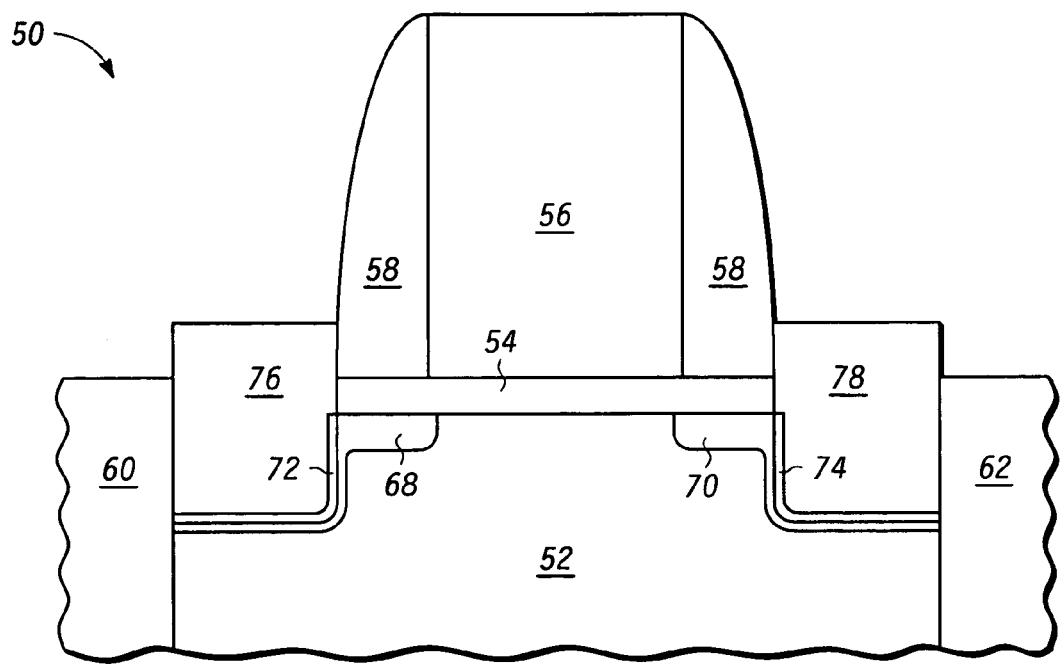
FIG. 7 is a cross section of the semiconductor structure of FIG. 6 at a subsequent stage in processing.

Shown in FIG. 7 is semiconductor structure 50 after formation of silicon germanium region 76 in cut out 64 and silicon germanium region 78 in cut out region 66. Silicon germanium regions 76 and 78 are epitaxially grown in known fashion. The result is that the germanium in silicon germanium region 76 faces barriers of silicon oxide at gate dielectric 54 at the edge of sidewall spacer 58 and trench isolation 60 and silicon carbon layer 72. Thus germanium atoms have no path to the interface of the gate dielectric 54 and the underlying channel.

Figure 8:
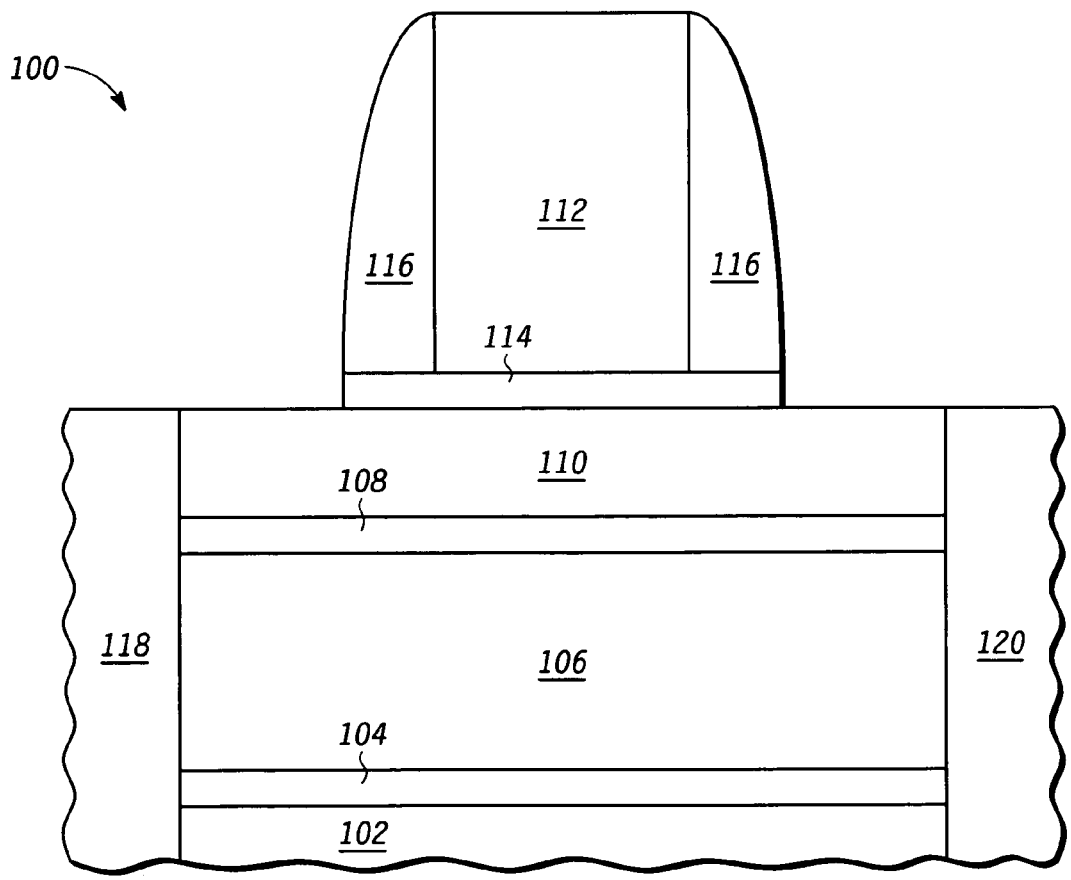
FIG. 8 is a cross section of a semiconductor structure according to a third embodiment of the invention at a stage in processing.

Shown in FIG. 8 is semiconductor structure 100 comprising a semiconductor substrate 102, a silicon carbon layer 104, a silicon germanium layer 106, a silicon carbon layer 108, a silicon layer 110 is on silicon carbon layer 108, a gate dielectric 114 is on silicon layer 110, a gate 112 is on gate dielectric 114, a sidewall spacer 116 is around gate 112, a trench isolation 118 on a first side of semiconductor structure 100, and a trench isolation 120 on a second side. Layers 104, 106, 108, and 110 are epitaxially grown. Silicon carbon layers 104 and 108 are preferably the same thickness as for silicon carbon layers 18 and 72 in FIGS. 2 and 6, respectively. Silicon germanium layer 106 is preferably 100–800 Angstroms. Silicon layer 110 is preferably 200 Angstroms in thickness. Silicon carbon layers 104 and 108 are barriers to germanium diffusion. In this case there is not only the potential problem with the germanium diffusing to the gate dielectric but also diffusing to the extent of depleting the germanium concentration to a level where it loses its purpose for effective selective etching relative to silicon. In this case, silicon germanium layer 106 must be etchable selective to silicon layers 110 and 102. If the germanium level is too depleted then this selectivity is lost. Thus silicon carbon layer 104 acts as a barrier to germanium diffusion to help prevent silicon germanium layer 106 becoming too depleted of germanium. Silicon carbon layer 108 provides this function of helping prevent germanium depletion and also preventing germanium from reaching gate dielectric 114 at the interface with silicon layer 110 in the area under gate 112.

Subsequent formation from the structure of FIG. 8 is known in the art. Descriptions for these processes are found at U.S. Pat. No. 6,656,782 B2, Skotnicki et al. and an article, IEDM 2001, page 645, by S. Monfray. This is known as silicon on nothing (SON).

Figure 9:
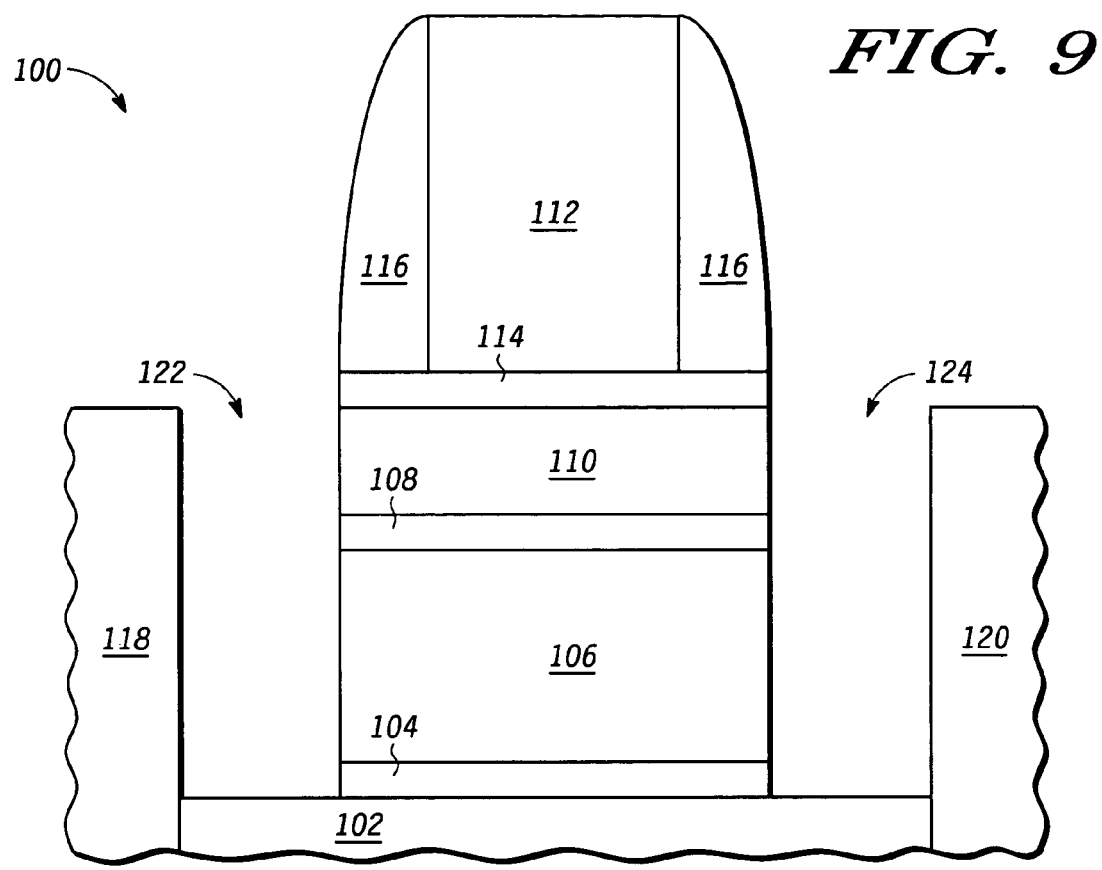
FIG. 9 is a cross section of the semiconductor structure of FIG. 8 at a subsequent stage in processing.

Shown in FIG. 9 is semiconductor structure 100 after a timed etch through silicon layer 110, silicon carbon layer 108, silicon germanium layer 106, and ultimately silicon carbon layer 104. This etch is aligned with sidewall spacer 116 and trench isolation 118 and 120 and leaves holes 122 and 124.

Figure 10:
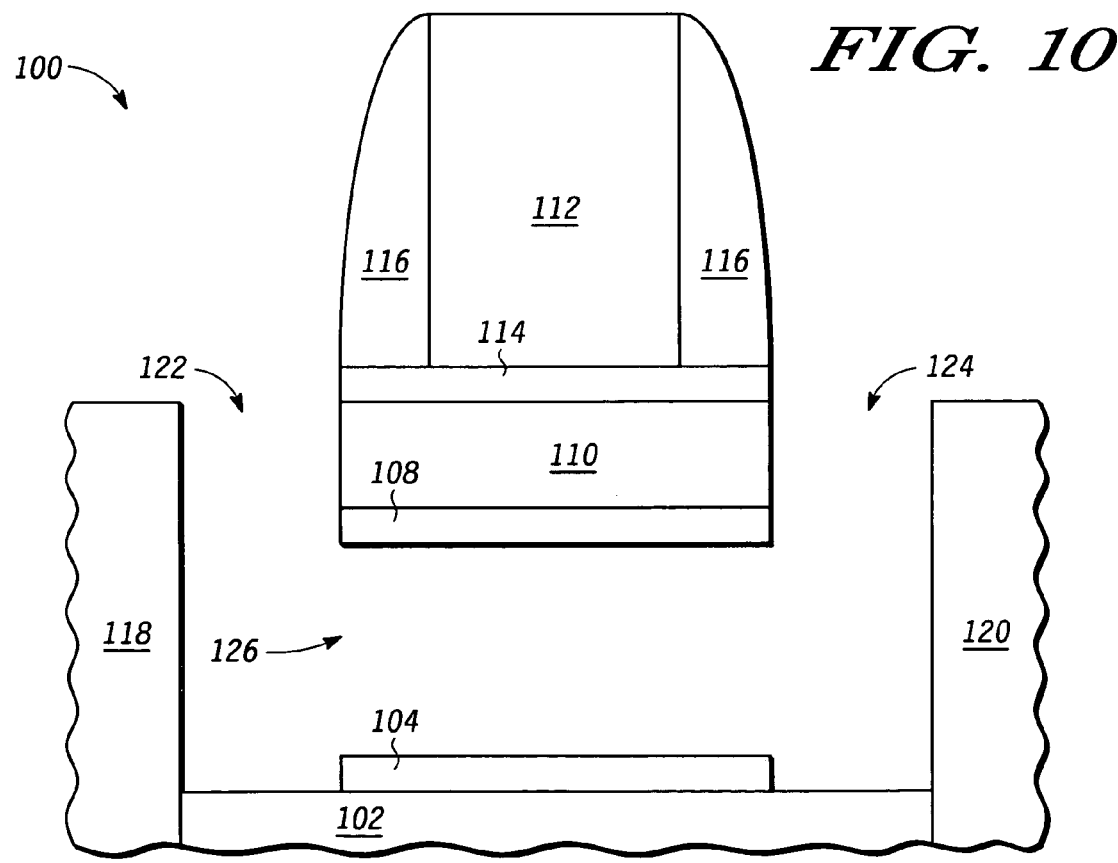
FIG. 10 is a cross section of the semiconductor structure of FIG. 9 at a subsequent stage in processing.

Shown in FIG. 10 is semiconductor structure 100 after removal of silicon germanium layer 106 by an isotropic etch. The etchant for this is preferably a solution of nitric acid $HNO_3$ and hydrogen peroxide ($H_2O_2$). Another isotropic etch such as an isotropic dry plasma may also be used. Semiconductor structure 100 as shown in FIG. 10 demonstrates why this is called silicon on nothing with a tunnel region 126 under silicon layer 110 and silicon carbon layer 108. Gate 112 is supported by trench isolation not shown in this cross section.

Figure 11:
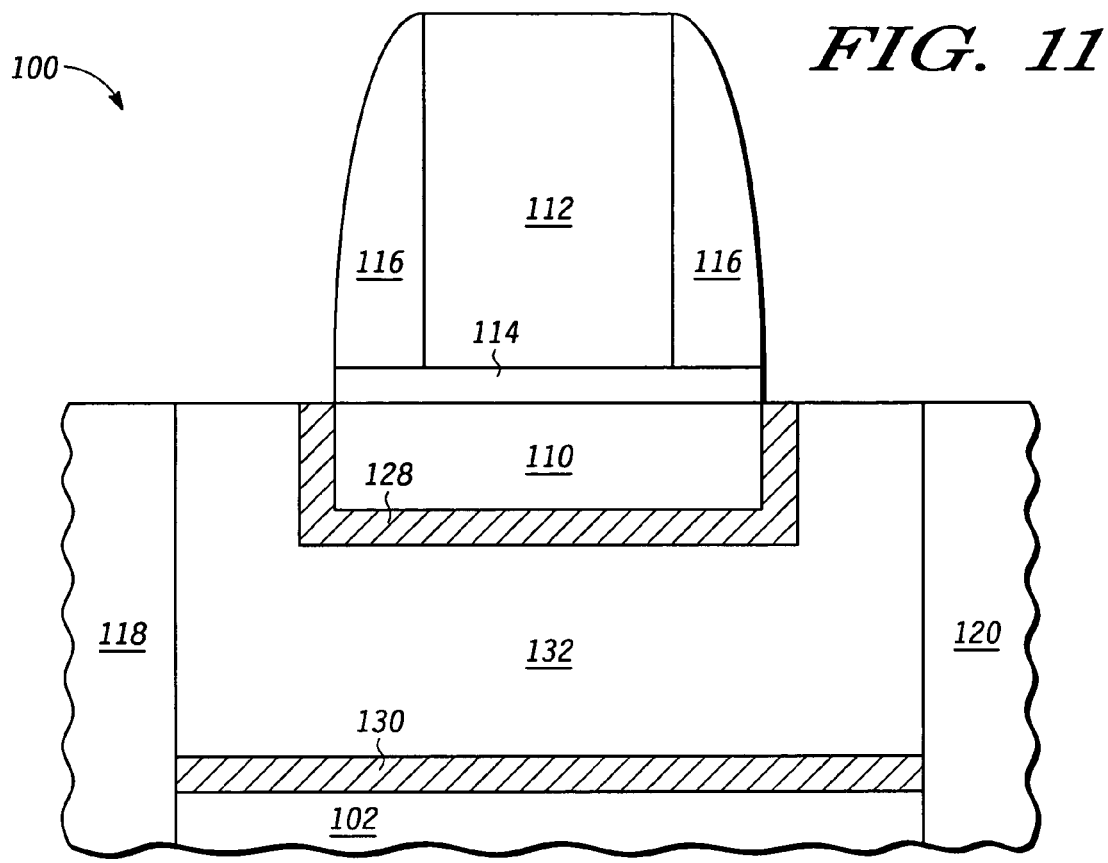
FIG. 11 is a cross section of the semiconductor structure of FIG. 10 at a subsequent stage in processing.

Shown in FIG. 11 is semiconductor structure 100 after filling tunnel region 126 and holes 122 and 124 by thermally growing silicon oxide layers 128 and 130 of FIG. 10 then depositing silicon nitride layer 132. The thermal growing of silicon oxide layer 128 and 130 has the effect of consuming layers 104 and 108 shown in FIG. 10.

Figure 12:
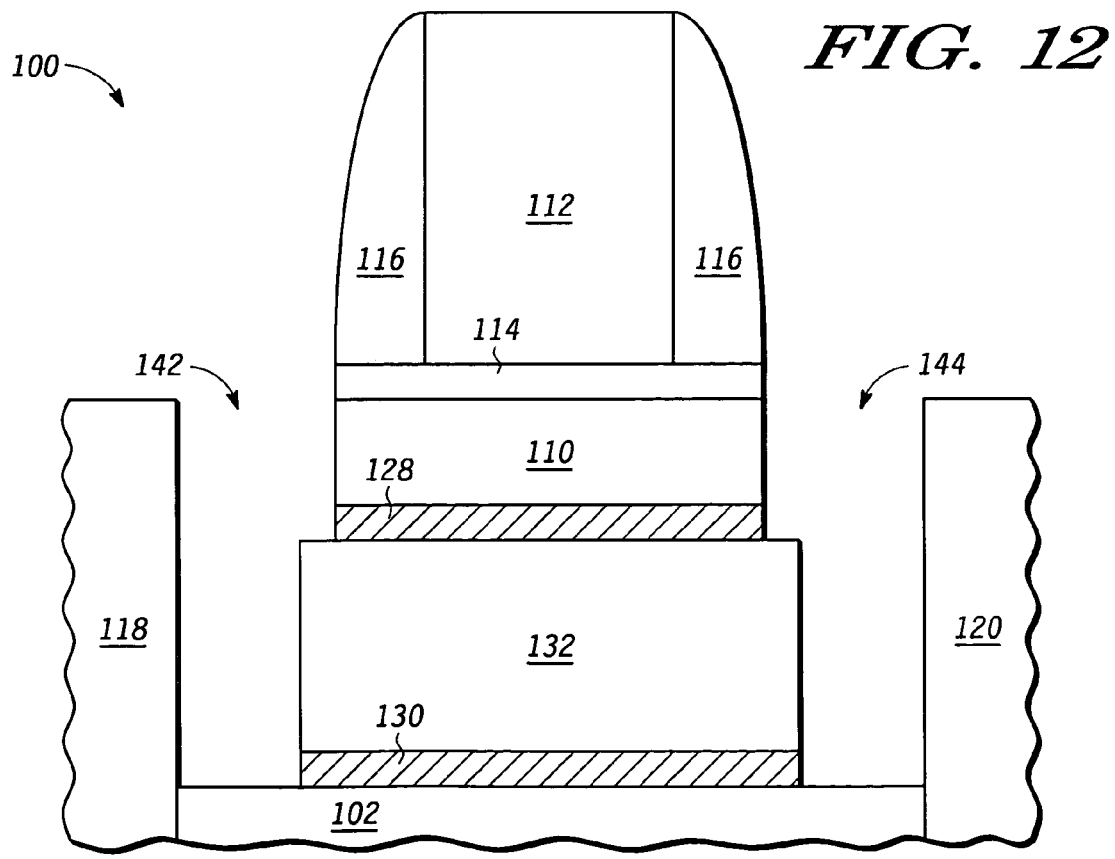
FIG. 12 is a cross section of the semiconductor structure of FIG. 11 at a subsequent stage in processing.

Shown in FIG. 12 is semiconductor structure 100 after performing an anisotropic silicon nitride and silicon oxide etch. This provides holes 142 and 144 in portions of silicon nitride 132 and silicon oxide layers 128 and 130 not directly under gate 112 and spacers 116.

Figure 13:
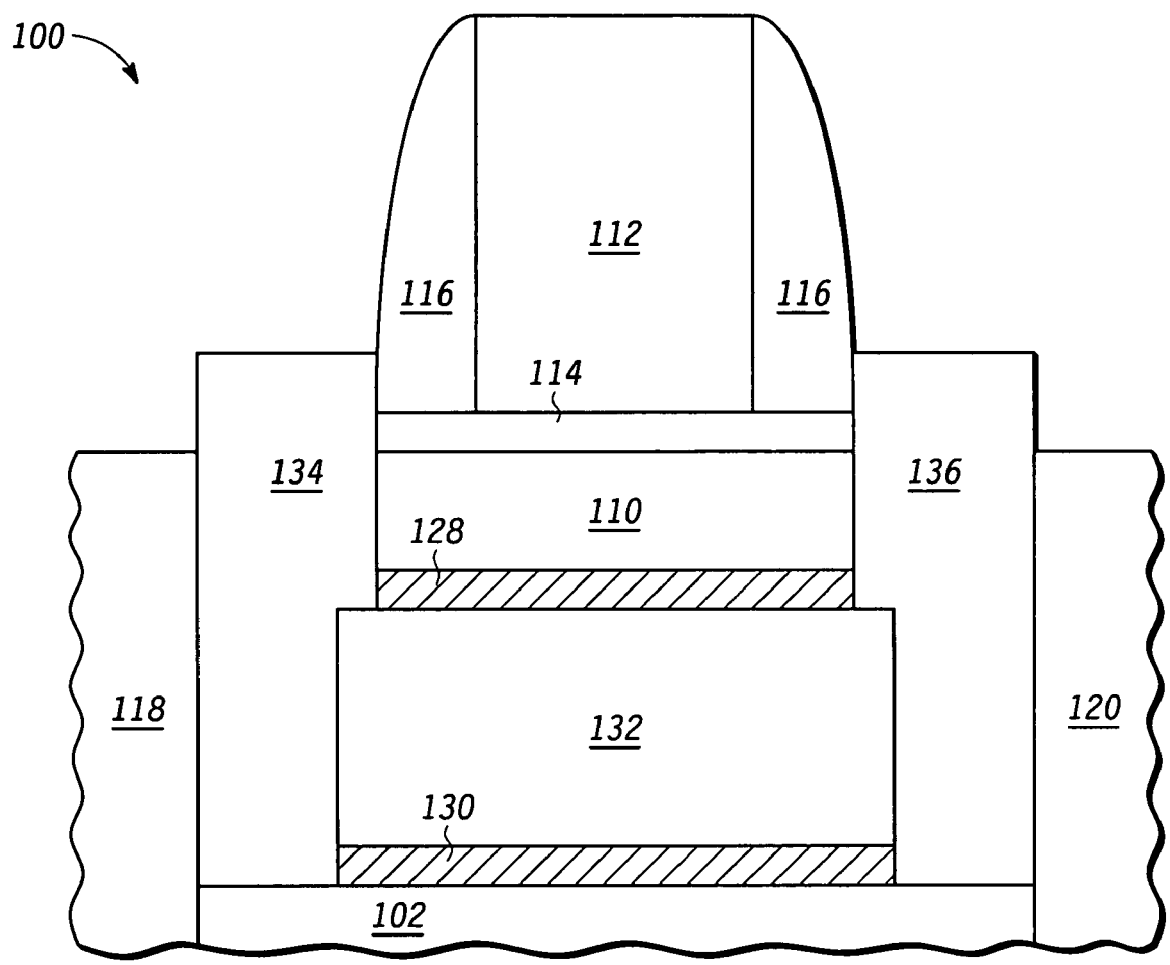
FIG. 13 is a cross section of the semiconductor structure of FIG. 12 at a subsequent stage in processing.

Shown in FIG. 13 is semiconductor structure 100 after epitaxially growing silicon regions 134 and 136 in holes 142 and 144 as shown in FIG. 12. A transistor is then made by removing sidewall spacers 116 and forming source/drain regions and source/drain extensions, which methodology is known to one of ordinary skill in the art.

In the foregoing specification, the invention has been described with reference to specific embodiments. However, one of ordinary skill in the art appreciates that various modifications and changes can be made without departing from the scope of the present invention as set forth in the claims below. For example, other embodiments not described herein may be implemented. Certain thicknesses were described and these may be varied. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a transistor, the method comprising:
   forming a first layer including silicon carbon over a material including silicon germanium;
   forming a layer including silicon over the first layer including silicon carbon;
   forming a gate over the layer including silicon;
   forming a gate dielectric between the gate and the layer including silicon; and
   removing the material including silicon germanium below the gate after the forming the gate;
   filling a material in a location from which the material including silicon germanium was removed;
   forming a second recess in the material in the location; and
   epitaxially growing semiconductor material, wherein the epitaxially growing includes growing semiconductor material in the second recess;
   wherein the first layer including silicon carbon functions as a barrier to germanium diffusion from the material including silicon germanium to the gate dielectric; and
   wherein the transistor includes a source/drain region, wherein at least a portion of the source/drain region is located in the semiconductor material epitaxially grown.

2. The method of claim 1 further comprising:
   forming the material including silicon germanium over a second layer including silicon carbon
   wherein the first and second layers including silicon carbon function as a barrier to germanium diffusion to prevent dilution of germanium concentration in the material including silicon germanium.

3. The method of claim 1 further comprising:
   oxidizing at least a portion of the layer including silicon carbon after the removing.

4. The method of claim 1 wherein:
   the transistor includes a channel region;
   at least a portion of the channel region is located in the layer including silicon.

5. The method of claim 1 further comprising:
   forming a recess in the layer including silicon and forming a recess in the first layer including silicon carbon prior to the removing the material.

6. The method of claim 1 wherein the forming the first layer including silicon carbon further includes:
   epitaxially growing the layer including silicon carbon on the material including silicon germanium.

7. The method of claim 1 wherein the first layer including silicon carbon has a thickness in the range of 20 Angstroms to 75 Angstroms.

8. The method of claim 1 wherein the removing includes etching the material including silicon germanium with an etchant that is selective with respect to silicon.

* * * * *